United States Patent [19]

Kersey

[11] Patent Number: 5,063,290
[45] Date of Patent: Nov. 5, 1991

[54] ALL-OPTICAL FIBER FARADAY ROTATION CURRENT SENSOR WITH HETERODYNE DETECTION TECHNIQUE

[75] Inventor: Alan D. Kersey, Springfield, Va.

[73] Assignee: The United States of America as represented by the Secretary of the Navy, Washington, D.C.

[21] Appl. No.: 582,274

[22] Filed: Sep. 14, 1990

[51] Int. Cl.⁵ .......................... H01V 5/16; G01B 9/02
[52] U.S. Cl. .............................. 250/227.17; 356/34.5; 356/351; 385/1
[58] Field of Search ............................... 356/345, 351; 250/227.17; 350/96.29

[56] References Cited

U.S. PATENT DOCUMENTS

| | | | |
|---|---|---|---|
| 4,255,018 | 3/1981 | Ulrich et al. | 250/227.17 |
| 4,642,458 | 2/1987 | Jackson et al. | 250/227.17 |
| 4,840,481 | 6/1989 | Spillman, Jr. | 250/227.17 |
| 4,866,266 | 9/1989 | Calvani et al. | 250/227.17 |
| 4,897,543 | 1/1990 | Kersey | 356/345 |
| 4,932,783 | 6/1990 | Kersey et al. | 250/227.17 |

Primary Examiner—Georgia Epps
Attorney, Agent, or Firm—Thomas E. McDonnell; George Jameson

[57] ABSTRACT

An all-optical-fiber Faraday effect sensor system and method are provided for detecting electric current. The sensor system includes a source for providing an input beam of frequency-modulated linearly-polarized light and, a polarization modulator for converting the input beam of frequency-modulated light into polarization-modulated light. A Faraday rotation current sensor passes the polarization-modulated light through a magnetic field generated by an electric current to be measured. The lines of force of the magnetic field are generally parallel to the direction of propagation of the polarization-modulated light. A detector and signal processing is used to derive an electrical heterodyne carrier signal which is phase modulated by the electric current. Detection of the phase of this carrier is used to determine the magnitude of the electric current.

16 Claims, 4 Drawing Sheets

ALL-OPTICAL FIBER FARADAY ROTATION CURRENT SENSOR WITH HETERODYNE DETECTION TECHNIQUE

FIELD OF THE INVENTION

The invention is directed to an electric current sensor, and in particular to a Faraday effect electric current sensor apparatus and method utilizing a fiber-optic frequency-induced polarization modulation approach.

BACKGROUND OF THE INVENTION

The Faraday effect relates to rotation in the plane of polarization of linearly polarized light, that is light passed through matter in the direction of the lines of force of an applied magnetic field. The magnitude α of the rotation depends on the strength of the magnetic field H, the nature of the transmitting substance, the frequency ν of the light, the temperature of the transmitting substance, and other parameters. In general, $\alpha = VxH$ where x is the length of the light path in the magnetized substance and V the so-called Verdet constant. The constant V is a property of the transmitting substance, its temperature, and the frequency of light.

Various optic fiber devices have been developed which exploit the Faraday effect for the measurement of electric current in a conductor. Such devices typically comprise one or more turns of optic fiber arranged in the form of a coil around the conductor. In accordance with the Faraday effect, the plane of polarization of linearly polarized light propogating in the optic fiber is rotated in proportion to the current passing through the conductor. Therefore, the electric current in the conductor can be calculated by measuring the degree of rotation of the linearly polarized light.

Both homodyne-based systems and heterodyne-based systems have been developed for measuring the degree of rotation of the linearly polarized light in a fiber optic sensor. Homodyne-based systems are disclosed in, for example, A. J. Rogers, IEEE J. Electron. Power Appl., 2, p. 20, 1977; A. M. Smith, Appl. Optic, 19, p. 3729, 1978. Heterodyne-based systems are disclosed in, for example, A. D. Kersey and D. A. Jackson, J. Lightwave Technology, Vol LT-4, No. 6, pp. 640-644 (June 1986).

Generally, fiber optic devices for measuring electric current employ specialty fibers, such as a helical core fiber (see M. P. Varnham et al., Digest ECOC/IOOC Conference Venice, p. 135, 1985), or a spun high-birefringence fiber (see L. Li et al., Electron. Lett., 22, p. 1142, 1986). Other special fibers include doped fibers with enhanced Verdet constants and annealed fibers which reduce both intrinsic birefringence and bend induced birefringence (see G. W. Day and S. M. Etzel, Digest ECOC/IOOC Conference Venice, p. 871, 1985).

SUMMARY OF THE INVENTION

In accordance with the invention, a fiber optic Faraday effect sensor system is provided for detecting electric current. The sensor system generally comprises: source means for providing an input beam of frequency-modulated linearly-polarized light, polarization modulation means for converting the input beam of frequency-modulated light into polarization-modulated light, Faraday rotation current sensing means for passing the polarization-modulated light through a magnetic field generated by an electric current wherein at least a portion of the magnetic field is generally parallel to the direction of propagation of the polarization-modulated light, and measurement means for measuring the Faraday rotation of the polarization-modulated light to thereby determine the magnitude of the current.

In a preferred embodiment, the source means includes: a current generator for providing modulation current, a linearly polarized diode laser for producing an input beam of frequency-modulated light in response to the modulation current, and a high-birefringence optical fiber for conveying the input beam to the polarization modulation means.

The polarization modulation means preferably includes a high birefringence optical fiber for receiving the frequency-modulated light into one polarization mode therein. The high birefringence optical fiber passes the frequency-modulated light through a 45° splice to split the one mode of frequency-modulated light into two modes of frequency-modulated light. A phase delay means provides a net polarization phase delay between the two modes of frequency-modulated light. The phase delay means comprises a length of high birefringence optical fiber having different effective optical paths corresponding to the two polarization modes of frequency-modulated light. An optical fiber λ/4 plate re-combines the two modes of frequency-modulated light into one beam of polarization-modulated light which is linearly polarized at an azimuth angle which varies as a function of the net polarization phase delay. The axis of the λ/4 plate is oriented +45° to the polarization axis of the high birefringence optical fiber.

In a preferred embodiment, an electric current to be measured is passed through a wire coil wrapped around a coil of ultra-low birefringence optical fiber such that the ultra-low birefringence optical fiber repeatedly passes the polarization-modulated light through the magnetic field generated by the electric current.

Preferably, the measurement means includes an output fiber polarizer which receives the Faraday rotated polarization-modulated light and allows only linearly polarized portion to pass therethrough as an output beam. An analyzer is provided for measuring the light intensity of the output beam and the intensity modulation of the output beam to thereby determine the magnitude of the electric current.

It will be appreciated from the foregoing that the system of the invention is implemented primarily with fiber optics and is less complex than prior art sensing systems. Further, the system is generally cheaper and more reliable than such prior art systems. Another advantage is the ability of the system to be used effectively in remote sensing applications.

Other features and advantages of the invention will be set forth in, or be apparent from, the detailed description of the preferred embodiments which follows.

DETAILED DESCRIPTION OF THE PREFERRED EMBODIMENT

Figure 1:
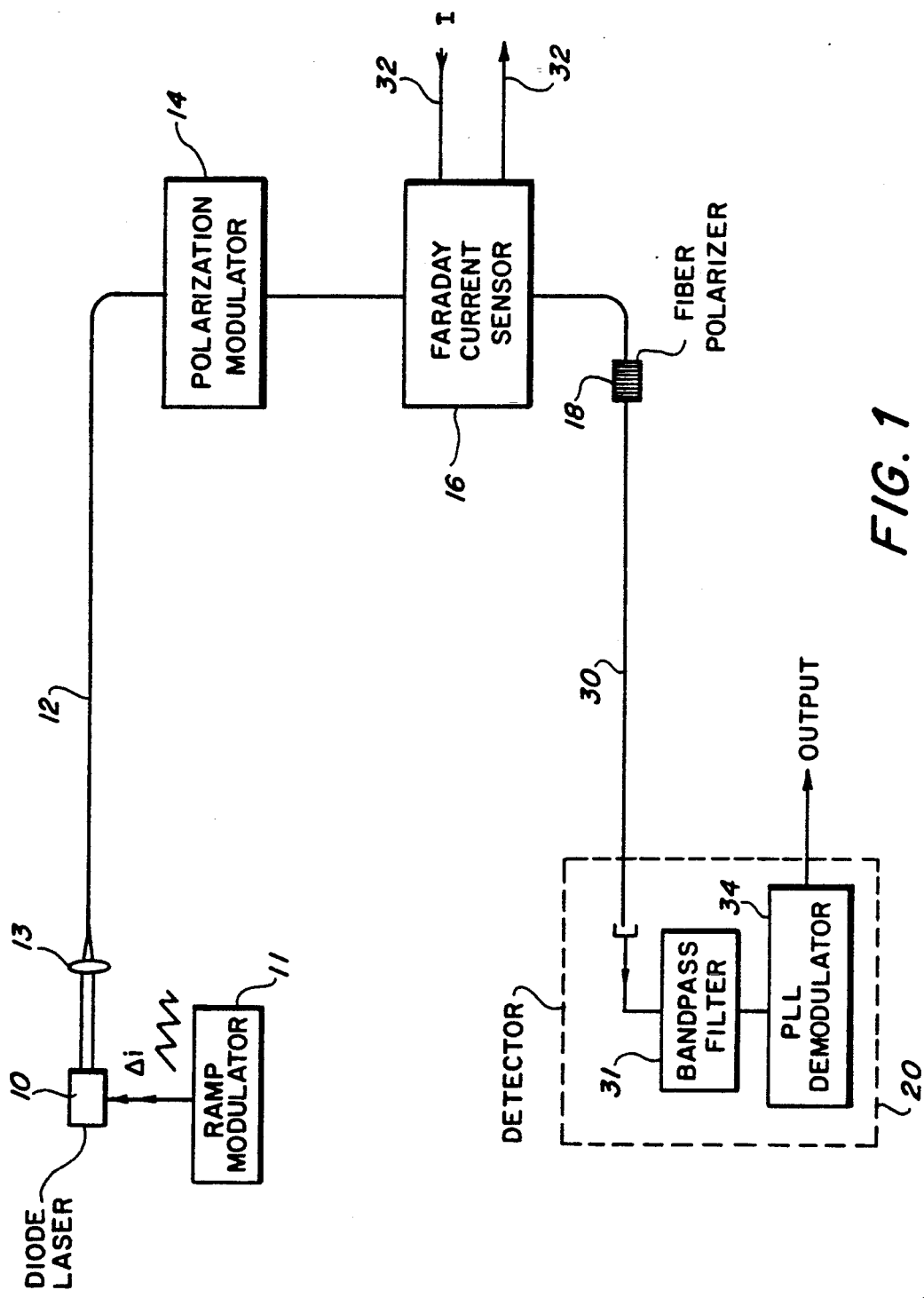
FIG. 1 is a schematic diagram of a preferred embodiment of the invention.

With reference to the FIG. 1, a preferred embodiment of the invention will be described. A diode laser 10 provides a beam of coherent light. The frequency of the light provided by diode laser 10 is modulated by a current ramp modulator 11. The light emitted from diode laser 10 passes through linear polarizer 13 and is coupled into one polarization mode of a high-birefringence (HB) optic fiber input lead 12. Input lead 12 conveys the frequency-modulated linearly polarized light a polarization modulator 14.

Polarization modulator 14 provides "optical-frequency-to-polarization" modulation which converts the frequency-modulated light provided by diode laser 10 into polarization-modulated light, i.e. polarization modulator 14 outputs linearly polarized light which is polarized at an azimuth angle that depends upon the frequency of the frequency-modulated light. Accordingly, the state of polarization of the light output from polarization modulator 14 is modulated in accordance with the frequency modulation of diode laser 10.

The polarization-modulated light output from polarization modulator 14 is coupled into a Faraday current sensor 16 which also receives an electric current which is to be detected through a conductor 32. Faraday current sensor 16 produces an additional rotation in the plane of polarization of the light which is a function of the strength of the electric current carried through conductor 32. (The plane of polarization of light is rotated in accordance with the Faraday effect which will be described in detail below.) As a result, Faraday effect sensor 16 outputs polarization-modulated light wherein the polarization azimuth is rotated as a function of the electric current in conductor 32.

The light from Faraday current sensor 16 is coupled directly into an in-line fiber polarizer 18 which converts the polarization-modulated light into intensity-modulated light. Any change in the polarization of the light input to polarizer 18, as caused by the Faraday effect in Faraday current sensor 16, is thereby converted into a change in the light intensity modulation output from polarizer 18.

A conventional fiber optic link 30 conveys the output from polarizer 18 to a light-intensity detector 20. Due to the ramp frequency modulation of the diode laser 10, the polarization at the output of the Faraday current sensor 16 rotates a complete $\pi$ change in azimuth for each ramp period. This causes the intensity of the resolved linear polarized component passed by the output in-line polarizer 18 to vary between maximum and minimum levels during each ramp cycle. This intensity modulated signal is passed to a bandpass filter 31 which is centered at the fundamental of the ramp modulation frequency. The presence of an electric current in conductor 32 causes an additional rotation of the instantaneous polarization-azimuth of the polarization-modulated light which passes through the Faraday current sensor 16. Consequently, the polarization modulation at the output of the Faraday current sensor 16 is either advanced or delayed by the Faraday effect depending on the polarity of the electric current, and the magnitude of this advancement or delay is linearly proportional to the magnitude of the electric current in the conductor 32. The presence of current in conductor 32 is thereby detected by detector 20 as a change in the timing of the detected maximum and minimum intensity points. After filtering by a bandpass filter 31, changes in the timing of the maximum and minimum intensity points are reflected as a change in phase of the electrical carrier signal at a frequency equal to the fundamental of the ramp modulator 11 produced at the output of the bandpass filter 31. This change in phase of the electrical carrier is then detected by a phase-locked loop (PLL) demodulator 34.

Figure 2B:
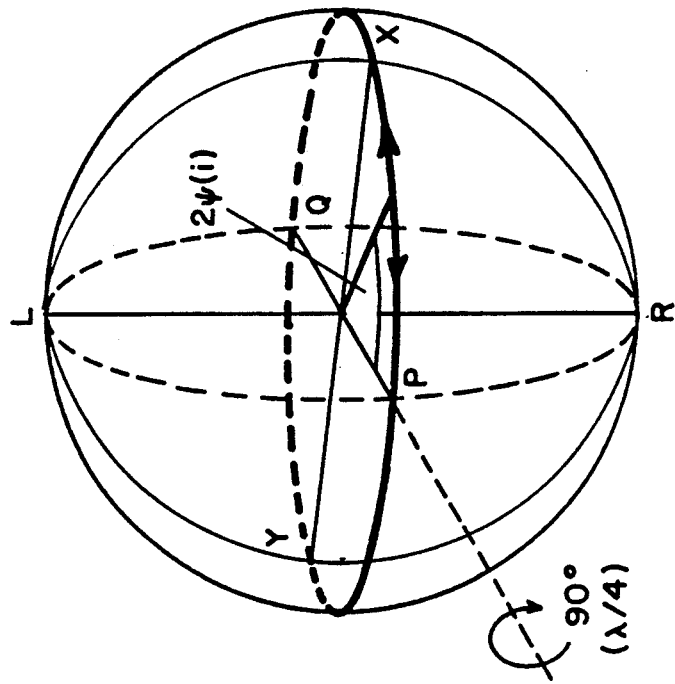
FIG. 2(b) is a Poincare sphere representation of the state of of the system along line B of FIG. 3.
Figure 2A:
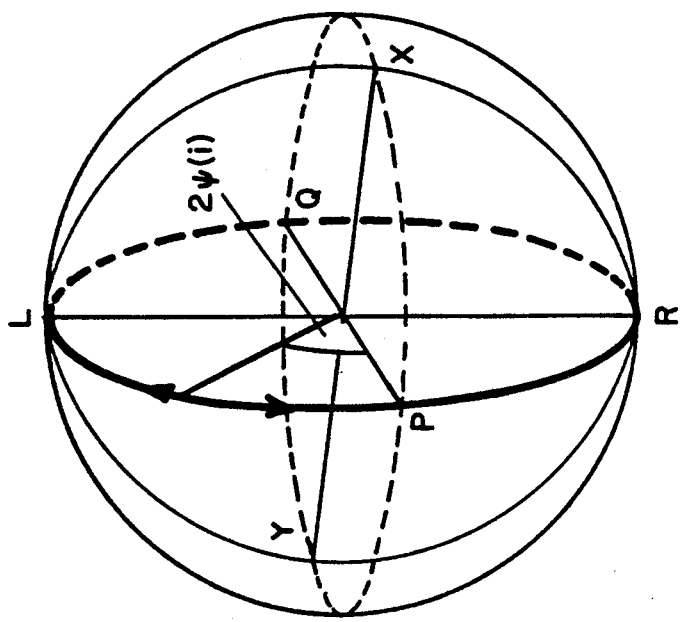
FIG. 2(a) is a Poincare sphere representation of the state of polarization of the system along line A of FIG. 3.
Figure 3:
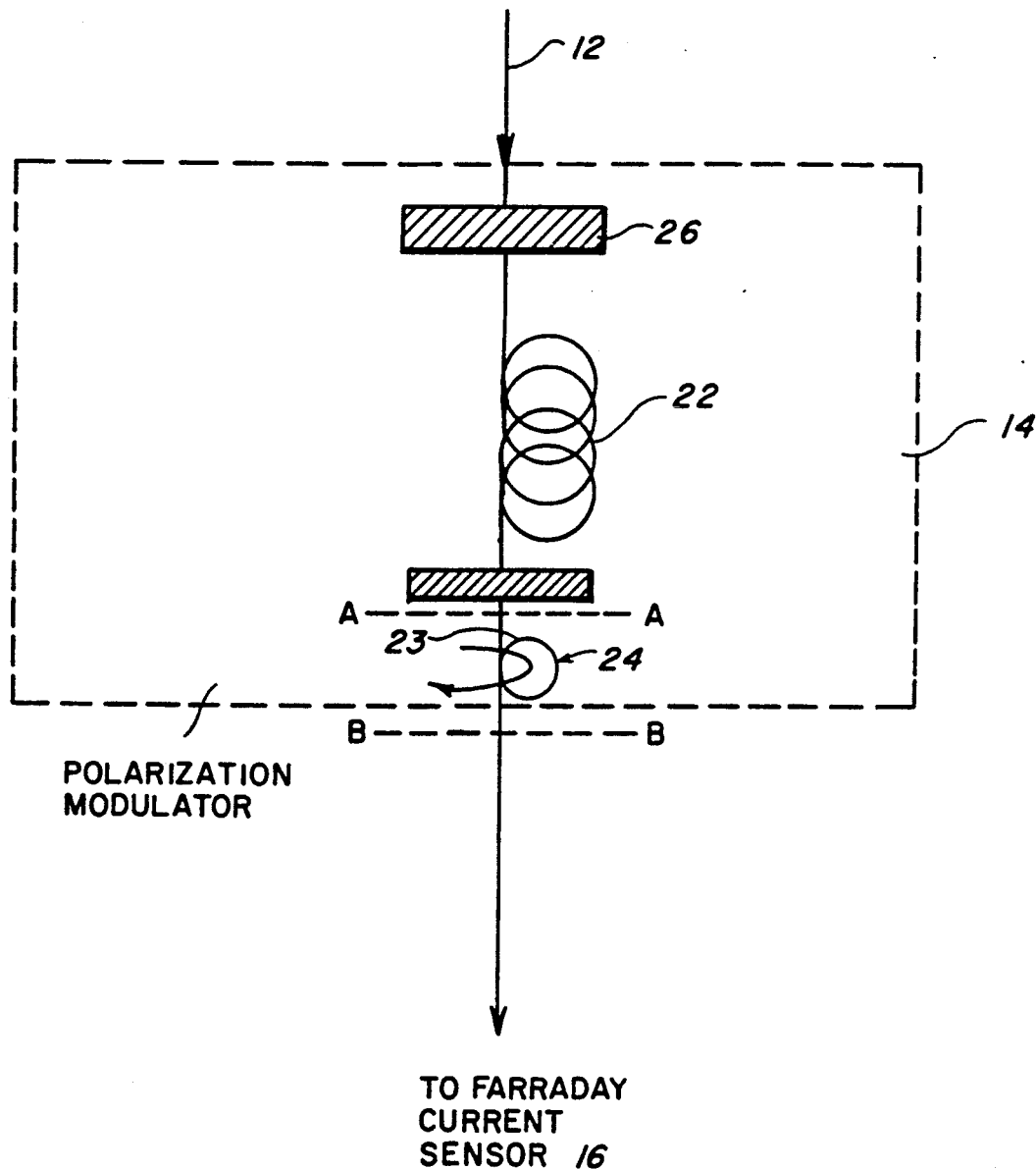
FIG. 3 is a schematic diagram or the polarization modulator invention.

Referring to FIGS. 2a, 2b, and 3, the operation of polarization modulator 14 will now be more fully described. As shown in FIG. 3, a high birefringence optic fiber coil 22 of length L receives light from input fiber 12 via a 45° coupler splice 26. The frequency-modulated light (passed through a single polarization mode of optic fiber 12) is equally coupled into two polarization modes of high birefringence fiber 22 by coupler splice 26. The two polarization modes have different effective optical paths, and high birefringence fibre 22 has sufficient length (L) such that the difference in effective optical paths yields a substantial net polarization phase delay between the two modes of light.

A fiber optic $\lambda/4$ plate 24 receives light from high birefringence coil 22 and produces polarization-modulated light by exploiting the net phase delay between the two modes of light. The $\lambda/4$ plate 24 comprises a low-birefringence fiber 23 with a single loop which is mounted such that the plane of fiber loop 23 is rotatable with respect to the polarization axes in high birefringence fiber 22. The orientation of $\lambda/4$ plate 24 is thereby adjustable such that a linear state of polarization is generated at the output (the azimuth of which depends linearly on the frequency of diode laser 10). The state of polarization of light entering the $\lambda/4$ plate 24 is confined to a great circle, circle PLQR on the Poincare sphere shown in FIG. 2(a), which passes through the poles (left and right circular states) and linear states at $\pm 45°$ to the polarization axes, which are denoted X and Y in FIG. 2(a), in the fiber coil 22. Waveplate 24, which is oriented with its axes at $\pm 45°$ to the modes of the HB-fiber coil 22, rotates the great circle PLQR on the Poincare sphere by 90° into the equatorial plane XPYQ, as shown in FIG. 2(b). Thus, the light from the waveplate 24 is linearly polarized at an azimuth which is a function of the net polarization phase delay of high birefringence coil 22.

Consequently, modulation of the optical emission frequency of diode laser 10 results in a modulation in the plane of polarization of the linearly polarized light at the output of waveplate 24. The azimuth $\Psi$ of the output plane of polarization (relative to the X mode of high birefringence fiber 22) is given by:

$$\Psi = \pi B L \, v/c \qquad (1)$$

where, B is the modal birefringence of the fiber, v is the laser emission frequency, and c is the velocity of light. A modulation in the laser frequency, $\Delta v$, thus results in a rotational modulation in the azimuth of the plane of polarization $\Delta \Psi$ given by $$\Delta \Psi = \{\delta \Psi / \delta v\} \Delta v = \pi B L \, \Delta v/c. \qquad (2)$$

Figure 4:
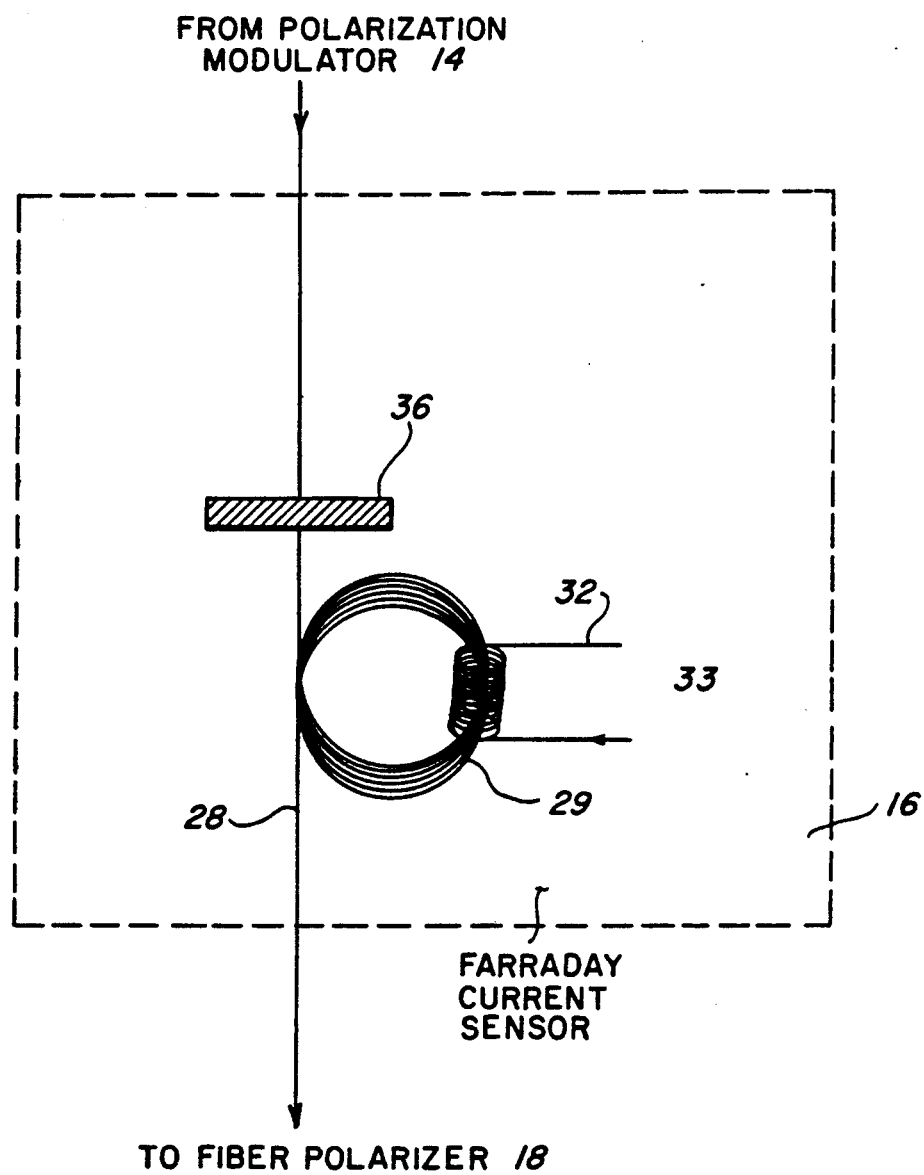
FIG. 4 is a schematic diagram of the Faraday current sensor of the invention.

Referring to FIG. 4, the Faraday effect sensor 16 will now be more fully described. Faraday effect sensor 16 includes an ultra-low birefringence fiber 28 wound in a coil configuration 29 which receives the polarization-modulated light from polarization modulator 14 via a splice coupler 36. A portion of conductor 32 is wound around a portion of sensing coil 29 to produce a conductor coil 33. Electric current to be measured or detected is passed through a conductor coil 33. Electric current carried in conductor 32 induces a magnetic field. Sensing coil 29 is wrapped around conductor 32 such that at least a portion of the magnetic field is generally parallel to the direction of propagation of light within sensing coil 29. The plane of polarization of light passing through sensing coil 29 is rotated in accordance with the Faraday effect. The ultra-low birefringence fiber 28 is twisted while it is wound to counteract the effects of bend-induced linear birefringence introduced by coiling the fiber 28. Therefore, Faraday current effect sensor 16 outputs polarization-modulated light wherein the polarization azimuth is rotated as a function of the electric current in conductor 32.

The net Faraday rotation generated by this configuration of sensing coil 29 and conductor coil 33 is $$\Phi_f = V N_f N_w I, \quad (3)$$

where V is the Verdet constant of sensing coil 29, I is the current in conductor coil 33 of $N_w$ turns, and $N_f$ is the number of fiber turns in sensing coil 29. At the output of sensing coil 29, the azimuth of the output polarization is $$\Psi_0 = \Psi(\nu) + \Delta\Psi(\Delta\nu) + \Phi_0 + \Phi_f(I) \quad (4)$$

where, $\Psi(v)$ and modulation $(\Delta i)$, $\Phi_0$ is a rotational bias in sensing coil 29 due to circular birefringence introduced by twisting the fiber, and $\Phi_f(I)$ is the current-dependent Faraday rotation.

The output of ultra-low birefringence fiber 28 is coupled via a fiber splice (not shown) into fiber polarizer 18.

Referring again to FIG. 1, the intensity of light coupled into output fiber 30 is $$J_0 = J_i \cos^2(\Psi_0 - \alpha), \quad (5)$$

where $\alpha$ is an angular offset which accounts for the arbitrary orientation of the output polarizer axes, and $J_i$ is the intensity after the input polarizer 11. Equation 5 is equivalent to $$J_0 = J_i \{1 - \cos(2\Delta\Psi + 2\Phi_f(I) - \zeta)\}/2 \quad (6)$$

where $\zeta = 2\alpha - 2\Phi_0 - 2\Psi(v)$ is the net phase offset term due to $\alpha$, $\Phi_0$, and $\Psi(v)$.

The output transfer function of Equation 6 is completely cycled by modulating the emission frequency of diode laser 10 with a sawtooth-waveform of deviation sufficient to induce a rotational modulation $\Delta\Psi = \pi$ rad. p—p. Bandpass filtering of the light at the fundamental of the ramp frequency, $\omega_r$, produces output which can be written as $$S = kJ_i \cos(\omega_r t + 2\Phi_f(I) - \zeta), \quad (7)$$

where k is an electronic gain factor. This describes a carrier signal of frequency $\omega_r$, phase-modulated by the Faraday effect rotation $2\Phi_f(I)$. Phase-locked loop 32 demodulates the output carrier.

The carrier described by Equation 7 is also phase-modulated by offset drift term $\zeta$. Phase drift is caused by laser frequency instability, and temperature induced changes in the birefringence of the OFP GB-fiber section. Also drift can occur in the rotational offset $\Phi_0$ in the sensing fiber coil. This drift is indistinguishable from Faraday rotation phase shifts induced by DC currents in the sensor. However, the detection of alternating currents (which is of primary interest), is unaffected.

In an exemplary non-limiting embodiment, input fiber 12 and output fiber 30 are each 100 m in length. High birefringence fiber coil 22 is formed from a 70 m length of high-birefringence fiber of 2.0 mm beat length wound to a 10 cm diameter. Low birefringence fiber 23 which forms waveplate 24 is 3.2 cm in diameter. Faraday sensing coil 29 consists of 187 turns of ultra-low birefringence fiber 28 wound on a 32 cm diameter former (not shown). Ultra-low birefringence fiber 28 is twisted at a low rate of 2 twists/turn to counteract the effects bend-induced linear birefringence introduced by coiling the fiber. Conductor coil 32 has 974 turns of 20 AWG wire.

The exemplary embodiment produces a Faraday rotation of 0.51 rad/A (29°/A). Modulating the input current of diode laser 10 by a ~5 mA p—p current ramp produces a laser frequency ramp of ~15 GHz p—p. This in turn induces a polarization-rotation modulation $\Delta\Psi = \pi$ rad. p—p in at the output of polarization modulator 14. The intensity-modulated output detected by detector apparatus 20 is passed through bandpass filter 34 centered at the frequency of ramp modulator 8 of 10 kHz to produce a carrier signal S, as defined in Equation (7) above.

Operation over a dynamic range of ~100 dB (30 µA/Hz to 3 A rms) is possible, limited only by excessive heating in the coil windings at higher currents. This corresponds to a range in the current of conductor 32 (i.e. I.N) of ~30mA to 3 kA (equivalent to approximately 5.6 A to 0.56 MA for a single fiber loop (i.e. $N_f = 1$) sensor configuration). The sensing range can be tailored to a particular application by varying the number of turns in sensing coil 29.

The invention thus far described allows heterodyne detection of Faraday effect rotation in a remote fiber coil using frequency-modulated laser-based signal processing. The all-fiber configuration of the invention is best used for remote sensors having no alignment or drift problems. The heterodyne signal processing technique of the invention achieves a very wide dynamic range since multiple $2\pi$ rotational excursions are accommodated in the demodulation process.

Although the invention has been described with respect to an exemplary embodiment thereof, it will be understood by those skilled in the art that variations and modifications can be effected in this exemplary embodiment without departing from the scope and spirit of the invention.

What is claimed is:

1. A sensor system for detecting an electric current, said system comprising:

source means for providing an input beam of frequency-modulated linearly-polarized light;

polarization modulation means for converting said input beam of frequency-modulated light into polarization-modulated light;

current sensing means for imparting a Faraday rotation to said polarization-modulated light as a function of the magnitude of the electric current to be detected; and means for measuring said Faraday rotation of said polarization-modulated light to determine the magnitude of said electric current.

2. The sensor system of claim 1 wherein said current sensing means comprises:
   a Faraday rotation current sensor for passing said polarization-modulated light through a magnetic field produced by application of the electric current to be detected thereto, the lines of force of said magnetic field being generally parallel to the direction of propagation of said polarization-modulated light so as to thereby impart a Faraday rotation to said polarization-modulated light.

3. The sensor system of claim 1, wherein said source means comprises:
   means for developing a modulation current;
   laser means for producing an input beam of frequency-modulated light in response to said modulation current;
   means for linearly polarizing said input beam of frequency-modulated light; and
   high-birefringence optical fiber for conveying said input beam of linearly-polarized frequency-modulated light to said modulation means.

4. The sensor system claim 3 wherein said developing means comprises a ramp current modulator.

5. The sensor system of claim 3 wherein said laser means comprises a diode laser.

6. The sensor system of claim wherein said polarization modulation means comprises:
   a high birefringence optical fiber for receiving one polarization mode of said frequency-modulated light and for passing said one mode of frequency-modulated light therethrough;
   means for splitting said one polarization mode of frequency-modulated light into two modes of frequency-modulated light;
   means for providing a net polarization phase delay between said two modes of frequency-modulated light; and
   means for combining said two modes of frequency-modulated light after said delay is provided into one beam of polarization-modulated light linearly polarized at an azimuth angle which depends upon the net polarization phase delay of said phase delay means.

7. The sensor system of claim 6 wherein said splitting means comprises a 45° splice within said high birefringence optical fiber.

8. The sensor system of claim 6 wherein said high birefringence optical fiber has a polarization axis and wherein said combining means comprises an optical fiber λ/4 plate having an axis oriented +45° to said polarization axis of said high birefringence optical fiber, wherein λ is the average wavelength of said frequency-modulated light.

9. The sensor system of claim 5 wherein said means for providing a net polarization phase delay comprises a length of high birefringence optical fiber having two different effective optical paths corresponding to said two modes of said frequency-modulated light.

10. The sensor system of claim 2 wherein said current sensing means comprises a coil of ultra-low birefringence optical fiber for repeatedly passing said polarization-modulated light through said magnetic field.

11. The sensor system of claim 10 wherein the electric current to be detected is passed through a wire coil wrapped around at least a portion of said ultra-low birefringence optical fiber coil.

12. The sensor system of claim 1 wherein said measuring means comprises:
   an output fiber polarizer for receiving said Faraday rotated polarization-modulated light and for allowing only a linearly polarized portion to pass therethrough as an intensity-modulated output beam; and
   analyzer means for measuring the light intensity of said output beam and for determining the phase shift of said intensity modulated output beam to determine the magnitude of said electric current.

13. The sensor system of claim 12 wherein said intensity-modulated output beam forms a heterodyne carrier signal containing a linear phase modulation placed on said heterodyne carrier signal by said electric current, and wherein said analyzer means comprises:
   means for generating said heterodyne carrier signal from said intensity-modulated output beam; and
   means for measuring the phase modulation of said heterodyne carrier signal to determine the magnitude of said electric current.

14. A method for detecting electric current comprising the steps of:
   providing an input beam of frequency-modulated linearly-polarized light;
   converting said input beam of frequency-modulated light into polarization-modulated light;
   imparting a Faraday rotation to the polarization-modulated light as a function of the magnitude of the electric current to be detected; and
   measuring said Faraday rotation of said polarization-modulated light to determine the magnitude of said electric current.

15. The method of claim 14 wherein said imparting step includes the step of:
   passing said polarization-modulated light through a magnetic field, generated by the electric current to be detected, and comprising lines of force generally parallel to the direction of propagation of said polarization-modulated light to thereby impart a Faraday rotation to said polarization-modulated light.

16. A sensor system for detecting an electric current, said system comprising:
   source means for providing an input beam of frequency-modulated linearly-polarized light;
   polarization modulation means for converting said input beam of frequency-modulated light into polarization-modulated light;
   Faraday rotation current sensing means for passing said polarization-modulated light through a magnetic field, produced by application of the electric current to be detected to sensing means, the lines of force of said magnetic field being generally parallel to the direction of propagation of said polarization-modulated light, so as to thereby impart a Faraday rotation to said polarization-modulated light; and
   measurement means for measuring said Faraday rotation of said polarization-modulated light to thereby determine the magnitude of said current,
   said source means comprising:
   current generator means for providing modulation current;
   laser means for receiving said modulation current and producing an input beam of frequency-modulated light in response to said modulation current, linear polarizer means for linearly polarizing said input beam of frequency-modulated light; and high-birefringence optical fiber for receiving said input beam of linearly-polarized frequency-modulated light and conveying said input beam of linearly-polarized frequency-modulated light to said modulator means;

said polarization modulation means comprising:

a high birefringence optical fiber for receiving one mode of said frequency-modulated light and for passing said one mode of frequency-modulated light therethrough;

splitting means for splitting said one mode of frequency-modulated light into two modes of frequency-modulated light;

phase delay means for providing a net polarization phase delay between said two modes of frequency-modulated light;

combining means for combining said two modes of frequency-modulated light after said delay is provided into one beam of polarization-modulated light linearly polarized at an azimuth angle which depends upon the net polarization phase delay of said phase delay means and the emission frequency of said laser means, said high birefringence optical fiber having a polarization axis and said combining means comprising a an optical fiber $\lambda/4$ plate having an axis oriented $+45°$ to said polarization axis of said high birefringence optical fiber, wherein $\lambda$ is the average wavelength; said phase delay means comprising a length of high birefringence optical fiber having two different effective optical paths corresponding to said two modes of said frequency modulated light, and said Faraday rotation current sensing means comprising a coil of ultra-low birefringence optical fiber for repeatedly passing said polarization-modulated light through said magnetic field; and said measurement means comprising:

an output fiber polarizer for receiving said Faraday rotated polarization-modulated light and for allowing only linearly polarized portion to pass therethrough as an intensity-modulated output beam; and analyzer means for measuring the light intensity of said intensity-modulated output beam and determining the phase shift of said intensity-modulated output beam to determine the magnitude of said electric current.

* * * * *